(12) United States Patent
Nakamura et al.

(10) Patent No.: US 7,236,231 B2
(45) Date of Patent: Jun. 26, 2007

(54) EXPOSURE APPARATUS AND DEVICE MANUFACTURING METHOD

(75) Inventors: Takashi Nakamura, Tokyo (JP); Hirohisa Ota, Kawagoe (JP); Eigo Kawakami, Utsunomiya (JP); Kazuyuki Kasumi, Utsunomiya (JP); Toshinobu Tokita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 162 days.

(21) Appl. No.: 11/090,519

(22) Filed: Mar. 24, 2005

(65) Prior Publication Data
US 2005/0219485 A1   Oct. 6, 2005

(30) Foreign Application Priority Data
Mar. 25, 2004  (JP) ............................. 2004-088650

(51) Int. Cl.
*G03B 27/42* (2006.01)
(52) U.S. Cl. ............................. 355/53; 355/67; 355/69; 355/71; 250/492.1; 250/492.2
(58) Field of Classification Search ................. 355/53, 355/67, 71
See application file for complete search history.

(56) References Cited

U.S. PATENT DOCUMENTS 5,900,637 A    5/1999  Smith 6,700,600 B1 *  3/2004  Sandstrom et al. ......... 347/256
6,777,697 B2 *  8/2004  Yui et al. ................ 250/492.22
2006/0132750 A1 *  6/2006  Gui et al. ..................... 355/69

FOREIGN PATENT DOCUMENTS

JP        2003-515255 A      4/2003
WO          01/37051 A1       5/2001

* cited by examiner

*Primary Examiner*—D. Rutledge
(74) *Attorney, Agent, or Firm*—Morgan & Finnegan, L.L.P.

(57) ABSTRACT

An exposure apparatus for scanning an exposure spot in an exposure allocated area and for exposing a desired pattern by controlling power of the exposure spot in accordance with an exposure pattern, includes an exposure unit for arranging plural fine exposure elements, for forming plural exposure spots F1 to F9 on an object to be exposed, and for previously defining the exposure allocated areas SA11 to SA19 respectively corresponding to the plural exposure spots F1 to F9, an exposure allocated area adjuster for adjusting the exposure allocated areas SA12 and SA15 in accordance with directions and sizes of offsets (offset amount vectors V2 and V5) of the exposure spots F2 and F5 from a reference position, and an exposure spot controller for controlling the power of the exposure spot in accordance with the exposure pattern corresponding to actual positions of the exposure spots F1 to F9.

16 Claims, 13 Drawing Sheets

PRIOR ART

EXPOSURE APPARATUS AND DEVICE MANUFACTURING METHOD

BACKGROUND OF THE INVENTION

The present invention relates to a maskless exposure apparatus that does not use a photo-mask to expose a wafer etc., and more particularly to a maskless exposure apparatus that arranges plural fine exposure means.

While the mainstream exposure apparatus projects the entire photo-mask pattern onto the wafer in manufacturing semiconductors, various types of prospective apparatuses have been attempted for a high throughput without the photo-mask. One example is a maskless exposure apparatus that independently controls positions and intensities of plural electron beams using plural electronic optical systems. Another example is a maskless exposure apparatus that arranges fine optical shutters and corresponding fine lenses in an array, opens and closes the shutters while scanning the array, and exposes a desired pattern. Still another example is a maskless exposure apparatus that brings an array of plural fine electrodes into contact with an object to be exposed, or scans the array located above and apart from the object by an extremely small distance, and exposes the object by emitting electrons from fine electrodes.

Commonly to these maskless exposure apparatuses, an exposure unit is formed which arranges plural one-dimensional or two-dimensional exposure means for exposing fine areas, and predetermined exposure areas allocated to these individual fine exposure means. The typical manufacturing process for these maskless exposure apparatuses previously measures an offset of a steady position of each fine exposure means from a reference position.

FIG. 10 is a view showing one illustrative conventional maskless exposure apparatus. FIG. 11 is a top view of a shutter lens array SLA. LS is a light source that generates collimated light. SLA is a shutter lens array that combines shutters and lenses one by one. W is a resist applied wafer. STG is a stage that is mounted with the wafer W and movable in the horizontal and height directions. CTR is a controller that holds pattern information PTN, runs a control program PGM1, and controls opening and closing the shutter and actions of the stage.

B1 is the collimated light generated by the light source LS. S1 is a shutter, which is fixed onto a top plate P1 via a hinge HG1 and opened and closed by a driving mechanism (not shown). A perforation hole H1 extends under the shutter. As the shutter S1 opens, the collimated light B1 reaches the lens L1 and is condensed on the wafer W. The lens L1 is fixed onto a lower plate P2. The shutter lens array SLA is provided with shutters S2 to S9 and lenses L2 to L9 having similar structures, and forms a 3×3 matrix. In FIG. 10, the shutter S3 opens and the condensed beam B2 reaches the wafer W.

A fundamental operation will be described with reference to FIG. 12. SU denotes a unit exposure area on the wafer W, which can be exposed by scanning of the shutter lens array SLA. F1 to F9 are exposure spots of condensed beams available as the shutters S1 to S9 open. SA01 to SA09 are exposure allocated areas corresponding to the shutters S1 to S9, where it is assumed that the exposure spots F1 to F9 have no positional offsets. The exposure allocated area that has no positional offset is referred to as an ideal exposure allocated area. Each of the exposure allocated area SA01 to SA09 is divided into 4×4 pixels, and exposed by arranging the exposure spot of the condensed beam at each pixel position. The exposure allocated area SA01 in FIG. 12 shows this state. For each pixel, a positional offset amount of the exposure spot is measured and the exposure spot is scanned.

In order to arrange the exposure spot of the condensed beam at a desired position, the shutter lens array SLA is moved zigzag along a unit driving curve R. The controller CTR opens and closes the shutters S1 to S9 in accordance with stored exposure pattern information PTN, exposing an arbitrary pattern in the unit exposure area SU. The control program PGM1 obtains data of the unit exposure area SU from the exposure pattern PTN based on the current position on the wafer W, and the data is divided into nine segments corresponding to the exposure allocated areas SA01 to SA09. The control program PGM1 opens and closes the shutters at proper timings based on the divided data while moving the shutter lens array along the unit driving curve R. Since each exposure allocated area is divided into 4×4 pixels, the total number of openings becomes 16. The wafer stage STG is driven along a global driving curve RG whenever the unit exposure area SU is exposed, thereby exposing the entire wafer W. This is the fundamental operation process.

A description will now be given of a positional offset of an exposure spot. A cause of this positional offset includes manufacture (or arrangement) errors of the shutter lens array, such as inclined attachment positions of the lenses L1 to L9. For example, as shown in FIG. 13 where it is assumed that the exposure spots F2 and F5 have positional offsets, the exposure spot F2 shifts by one pixel in the Y direction and the exposure spot F5 shifts one pixel in each of the X and Y directions. Then, the shutter opening/closing control timing as that used for no positional offset exposure results in the defective exposure. For example, the exposure spot F5 shifts from the original position the pattern that is to be exposed on the exposure allocated area SA05 and part of the pattern overlaps the exposure allocated area SA08. Accordingly, when the positional offset of the exposure spot is found beyond the permissible range, the exposure unit is disposed or reassembled to reduce the offset amount and prevent defective exposure.

Prior art includes PCT National Phase Application No. 2003-515255, and U.S. Pat. No. 5,900,637.

As discussed, the conventional maskless exposure apparatus needs a disposal or a reassembly of the entire unit when the exposure means contains a large offset amount, lowering the yield and increasing the cost of the exposure apparatus. When the arrangement of the exposure means offsets due to the time variations, the entire exposure unit is also disposed or reassembled. Therefore, there is a demand for an exposure apparatus that can maintain the highly precise exposure even when each exposure means has a positional offset, and does not require a disposal and reassembly of the exposure unit.

BRIEF SUMMARY OF THE INVENTION

The present invention is directed to a maskless exposure apparatus that maintains the precise exposure even when the exposure spot has a positional offset.

An exposure apparatus according to one aspect of the present invention for scanning an exposure spot in an exposure allocated area and for exposing a desired pattern by controlling power of the exposure spot in accordance with an exposure pattern, includes an exposure unit for arranging plural fine exposure elements for forming plural exposure spots on an object to be exposed, and for previously defining the exposure allocated areas corresponding to the plural exposure spots respectively, an exposure allocated area adjuster for adjusting the exposure allocated areas in accordance with directions and sizes of offsets of the plural exposure spots from reference positions, and an exposure spot controller for controlling the power of the exposure spot in accordance with the exposure pattern corresponding to an actual position of each exposure spot.

An exposure apparatus according to another aspect of the present invention includes an exposure array for arranging plural exposure sections for irradiating a beam onto an object to be exposed, a controller for setting an exposure area and pattern data in the exposure area based on arrangement errors of the exposure sections in the exposure array, the exposure area being exposed by the beam from each exposure section, a stage for moving the object relative to the exposure array based on the exposure area set by the controller, and a shutter array for arranging plural shutters for controlling a beam irradiation from the exposure section based on the pattern data set by the controller.

An exposure apparatus according to still another aspect of the present invention includes a probe array for arranging plural probes for emitting electrons to an object to be exposed, a controller for setting an exposure area and pattern data in the exposure area based on an arrangement error of the probes in said probe array, said exposure area being exposed by the electrons from each probe, a stage for moving the object relative to the probe array based on the exposure area set by said controller; and a cantilever array for arranging plural cantilevers for controlling heights of the probes relative to the object based on the pattern data set by said controller.

A device manufacturing method according to another aspect of the present invention includes the steps of exposing an object using the above exposure apparatus, and developing the object exposed by the exposing step.

Other objects and further features of the present invention will become readily apparent from the following description of the embodiments with reference to accompanying drawings.

DETAILED DESCRIPTION OF THE PREFERRED EMBODIMENTS

Referring now to the accompanying drawings, a description will be given of preferred embodiments of the present invention.

First Embodiment

Figure 1:
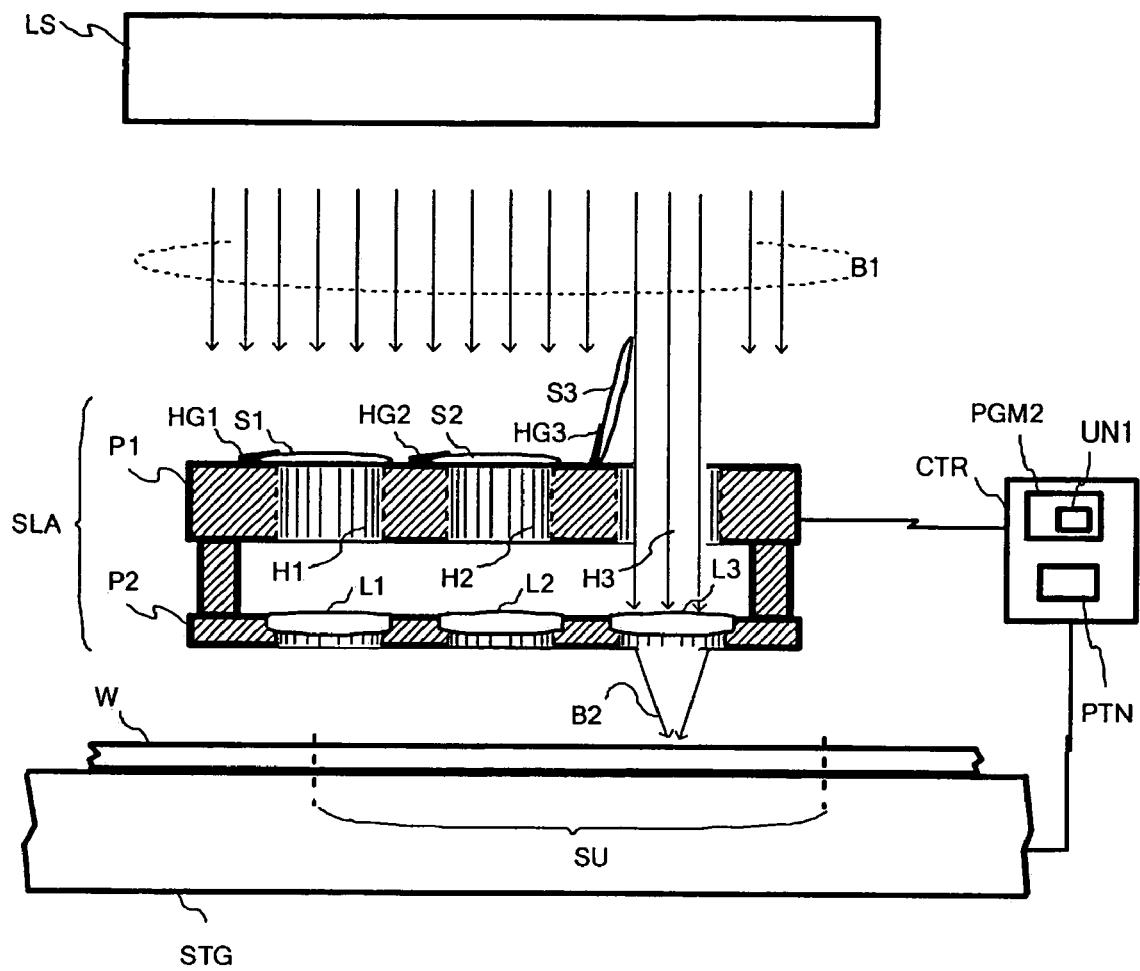
FIG. 1 is a view showing a maskless exposure apparatus according to one embodiment of the present invention.
Figure 10:
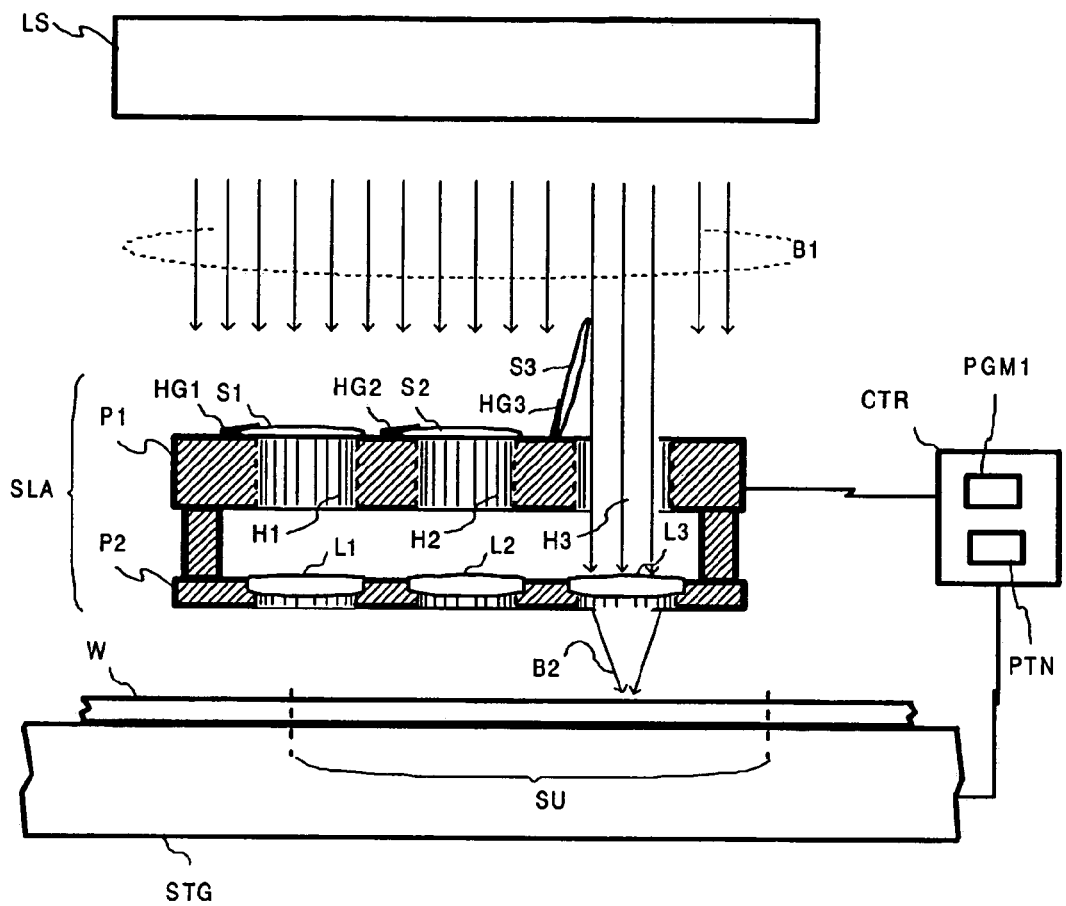
FIG. 10 is a view showing a conventional maskless exposure apparatus that uses a shutter lens array.

A description will now be given of a maskless exposure apparatus according to one embodiment of the present invention. FIG. 1 is a view showing a maskless exposure apparatus according to one embodiment of the present invention. Almost similar to the exposure apparatus shown in FIG. 10, each of lenses L1 to L9 corresponding to perforation holes H1 to H9 in this exposure apparatus serve as a fine exposure means or part, but a control program PGM2 in the controller CTR is different from the control program PGM1 in FIG. 10.

The control program PGM2 includes a reallocation unit UN1 that serves to reallocate sizes and positions of the exposure allocated areas, as detailed later.

Figure 11:
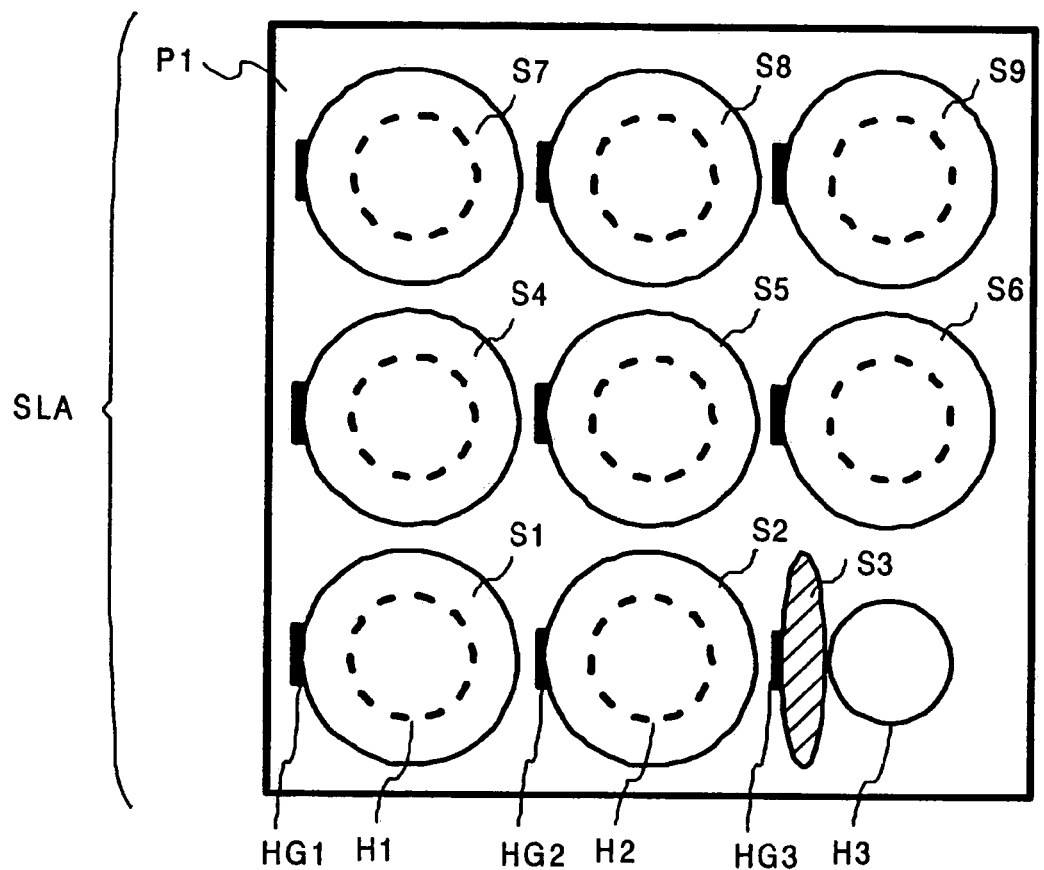
FIG. 11 is a top plane view of the shutter lens array.
Figure 12:
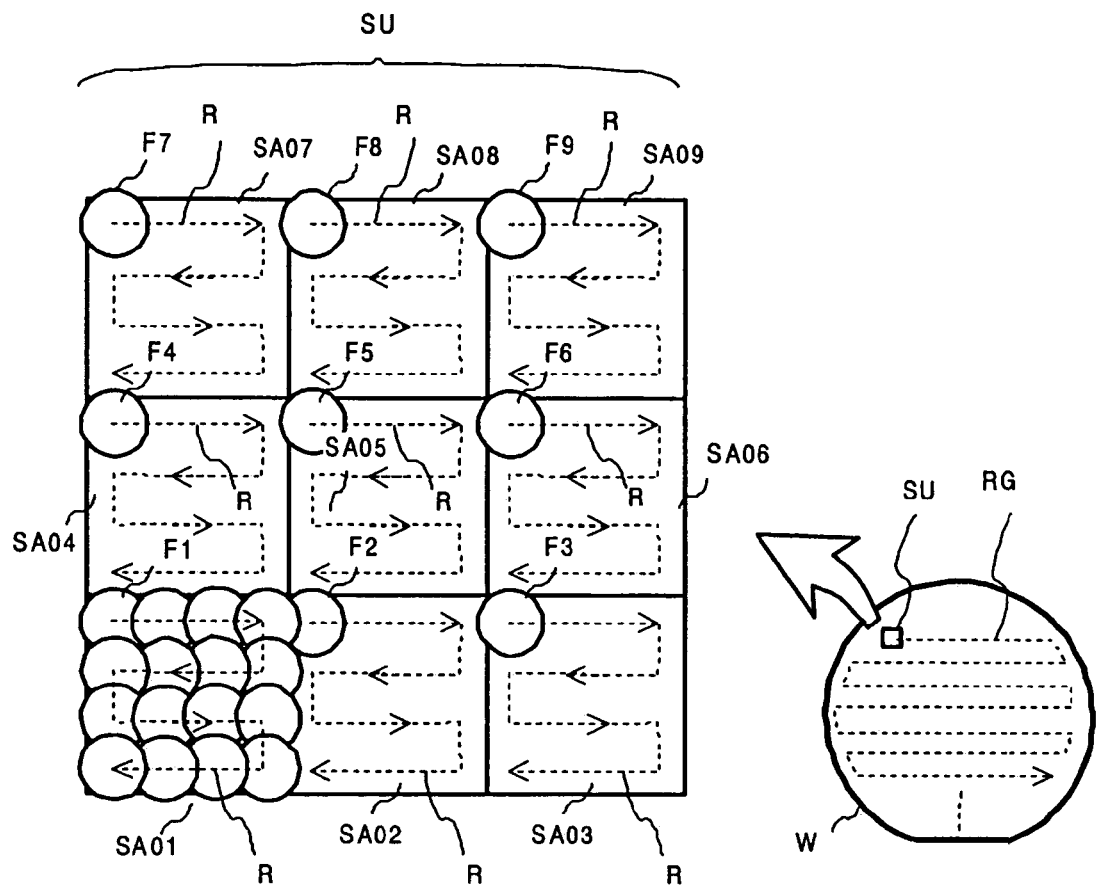
FIG. 12 is a plane view for explaining scanning of exposure spots.

The shutter lens array SLA is structurally similar to that described with reference to FIG. 11, and the operations where the exposure spots do not have positional offsets are similar to those in the conventional method described with reference to FIG. 12.

Figure 13:
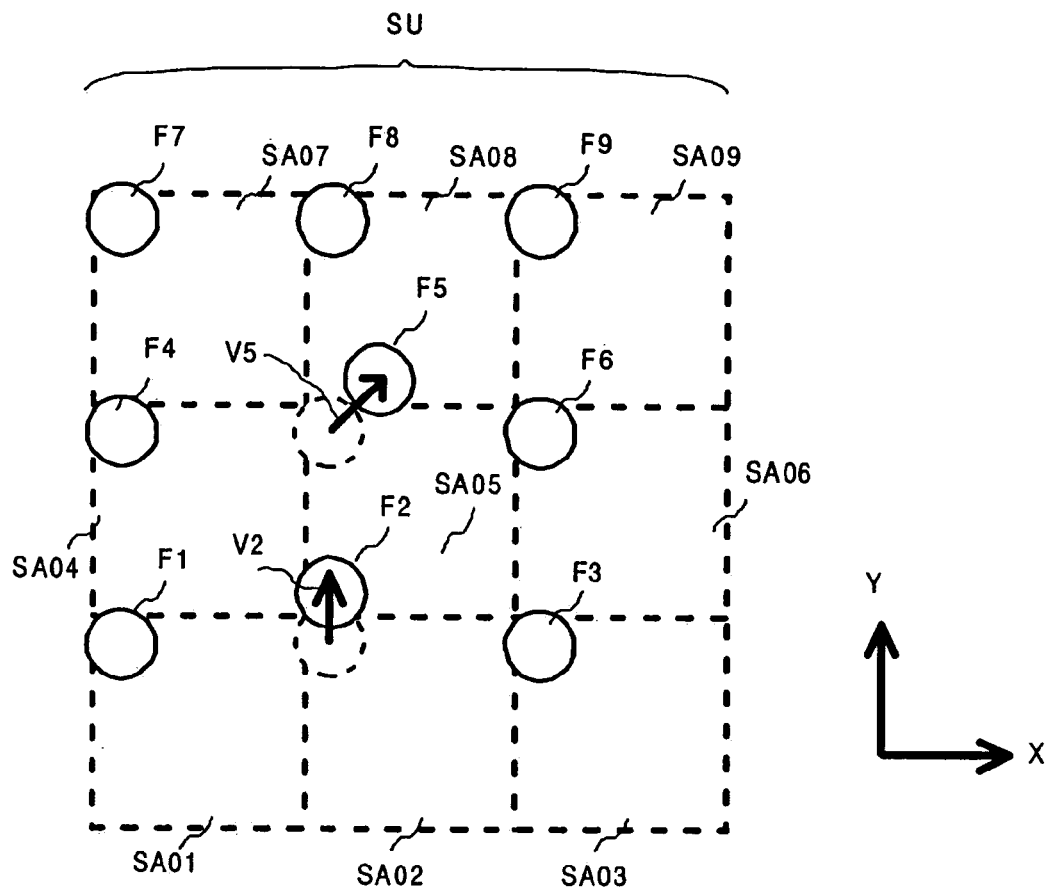
FIG. 13 is a plane view showing illustrative positional offsets of exposure spots.

A description will now be given of the exposure spots of the condensed beam having positional offsets. The exposure spots F2 and F5 are offset from the predetermined reference positions by offset amount vectors $V2=(0, 1)$ and $V5=(1, 1)$ in FIG. 13.

The exposure apparatus according to the embodiment of the present invention is controlled in accordance with the program PGM2 in the controller CTR. First, the reallocation unit UN1 reallocates the offsetting exposure spot and its vicinity by adjusting a size and position of each exposure allocated area. In this embodiment, the exposure allocated area is defined as one that includes an initial position of each exposure spot and has an exposable rectangular shape by scanning along the unit driving curve R, because this way facilitates and expedites the allocation procedure.

Figure 2:
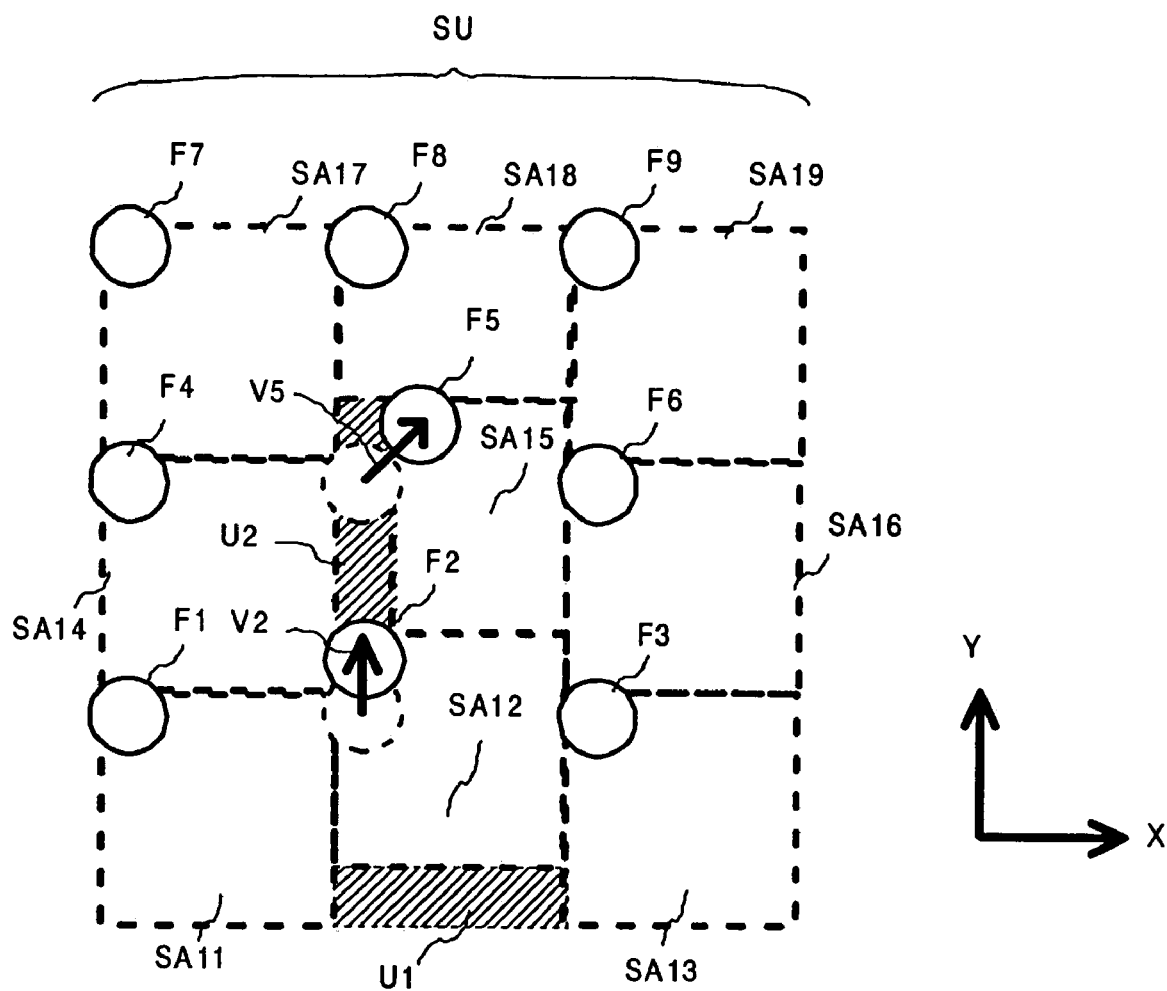
FIG. 2 is a plane view for explaining a reallocation of exposure allocated areas according to a first embodiment of the present invention.

FIG. 2 shows a reallocation result of the exposure allocated area in this example. SA11 to SA19 denote new exposure allocated areas corresponding to the exposure spots F1 to F9. In exposure, the shutters S1 to S9 are opened and closed, and the shutter lens array SLA is scanned along the unit driving curve R. As understood from FIG. 2, the exposure allocated areas corresponding to the exposure spots F2, F5 and F8 are different from those having no positional offset. Therefore, the opening and closing control over the shutters S2, S5 and S8 should shift by the amounts corresponding to the offset amount vectors.

The opening and closing control over the shutters S1 to S9 may utilize, for example, the following method. A table of the XY coordinate of the current positions of the exposure spots S1 to S9 is stored and adapted to be updateable on a real-time basis. When each exposure spot resides in the corresponding exposure allocated area while the exposure spots F1 to F9 are being scanned, the exposure data corresponding to the XY coordinate of the current position of each exposure spot is picked up from the exposure pattern information PTN and it is determined whether the shutter corresponding to the exposure spot is to open or close.

U1 and U2 denote unexposed exposure areas that cannot be scanned by one scanning operation along the unit driving curve R. The unexposed exposure area U1 is exposable through scanning by moving down the shutter lens array SLA by one pixel. The unexposed exposure area U2 is also exposable through scanning by moving the shutter lens array SLA to the left by one pixel. Without the unexposed exposure area U1 or U2, such exposure is unnecessary.

Second Embodiment

Figure 3:
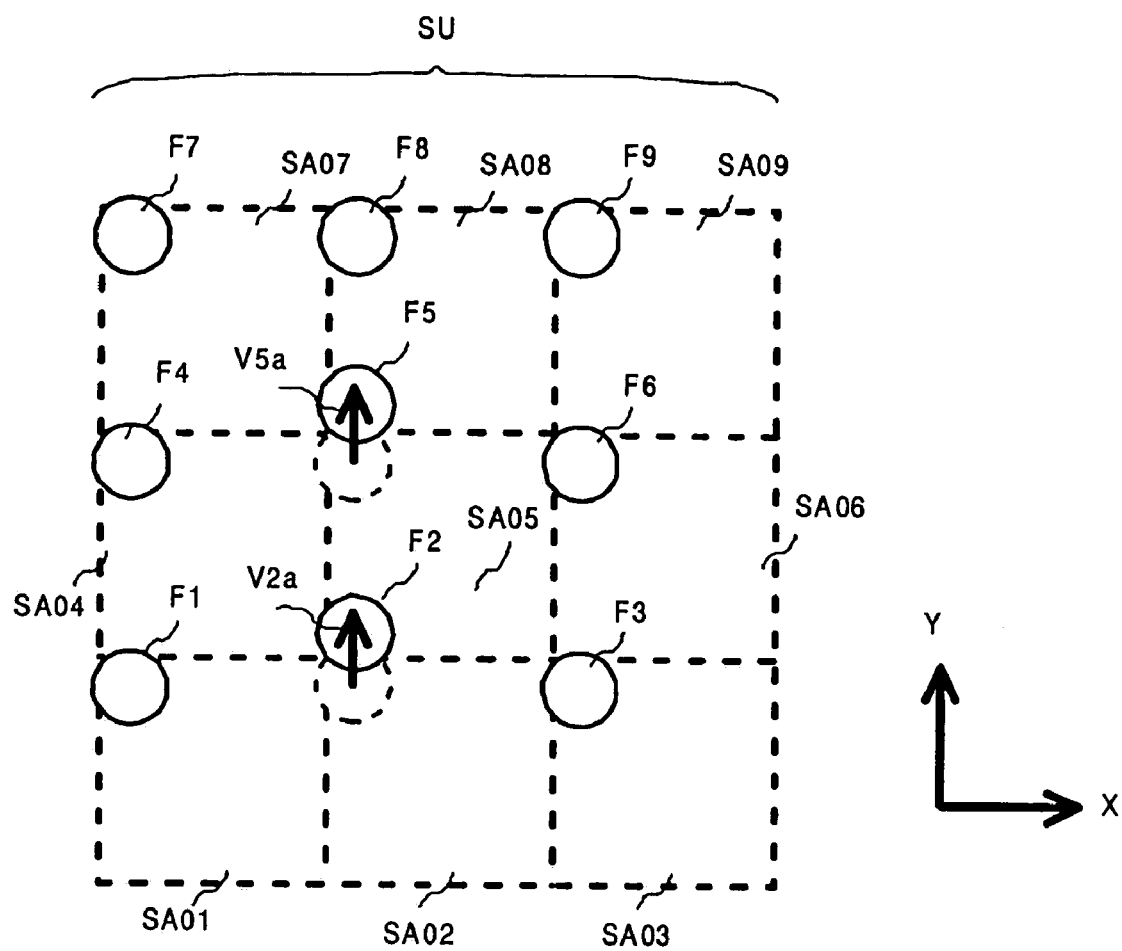
FIG. 3 is a plane view showing illustrative positional offsets of exposure spots.

FIG. 3 shows another illustrative positional offset arrangement different from that in the first embodiment. The exposure spots F2 and F5 are offset by offset amount vectors V2a=(0, 1) and V5a=(0, 1) in FIG. 3. The controller CTR reallocates the exposure allocated area of the offsetting exposure spot and its vicinity. In this embodiment, the exposure allocated area is defined as one that includes an initial position of each exposure spot and has an exposable rectangular shape by the normal scanning along the unit driving curve R, similar to the first embodiment. The second embodiment reallocates the exposure allocated area so that the unit exposure area SU can have a rectangular shape, if possible. This is because the rectangular unit exposure area SU can eliminate the step of re-exposing the same unexposed area. The controller CTR determines whether the unit exposure area SU can be shaped like a rectangle in view of the offset amount vectors of all the exposure spots.

Figure 4:
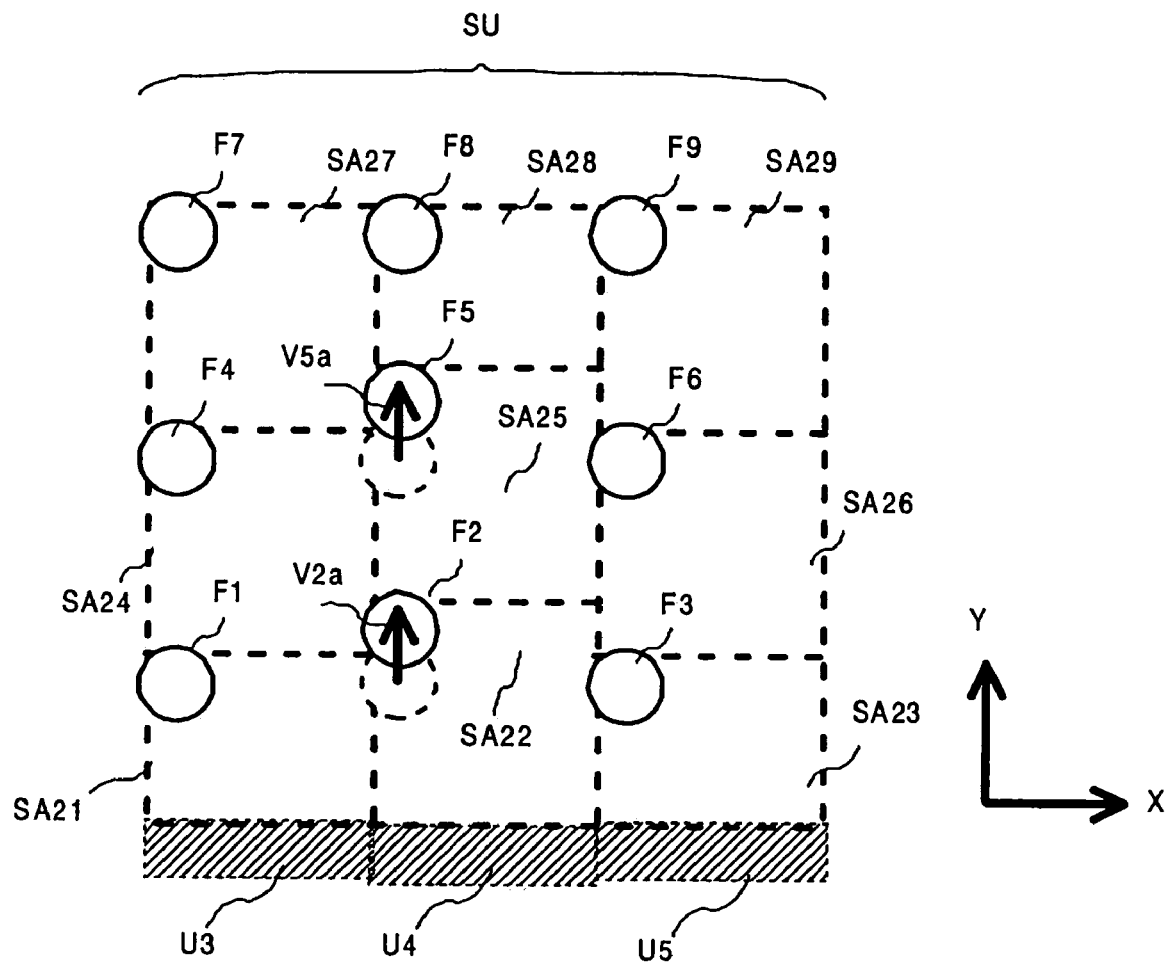
FIG. 4 is a plane view for explaining a reallocation of exposure allocated areas according to a second embodiment of the present invention.

FIG. 4 shows a reallocation result of the exposure allocated area in this example. SA21 to SA29 denote new exposure allocated areas corresponding to the exposure spots F1 to F9. U4 is an unexposed area that cannot be scanned by the normal scanning along the unit driving curve R. The unexposed areas U3 and U5 are exposable by the normal scanning, but defined as unexposed areas by closing the shutters S1 and S3 to form the rectangular unit exposure area SU. This embodiment is similar to the above embodiment in that the shutters S1 to S9 are opened and closed while the shutter lens array SLA is being scanned. While this embodiment defines the unexposed area so that the unit exposure area SU has a rectangular shape, the shape is not limited to the rectangle, and may use any other shapes as long as they can cover the wafer surface in a matrix. In addition, it is optional to include the initial position of the exposure spot corresponding for each exposure allocated area.

Figure 5:
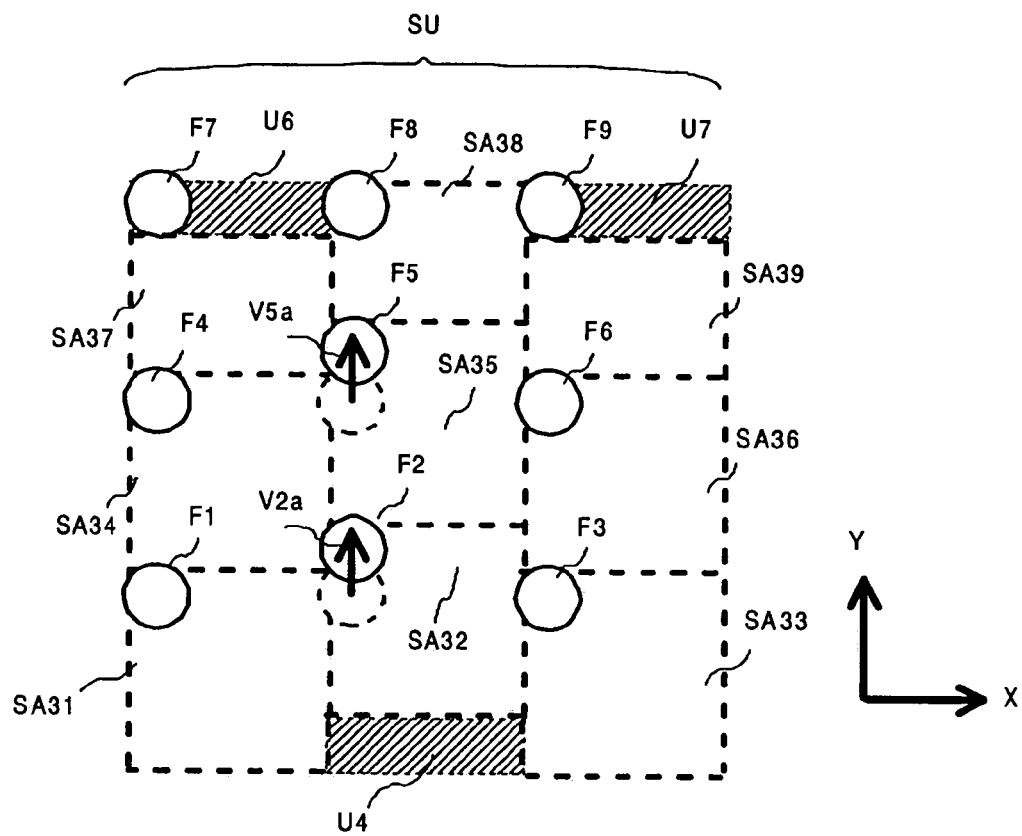
FIG. 5 is a plane view for explaining a reallocation of exposure allocated areas according to the second embodiment of the present invention.
Figure 6:
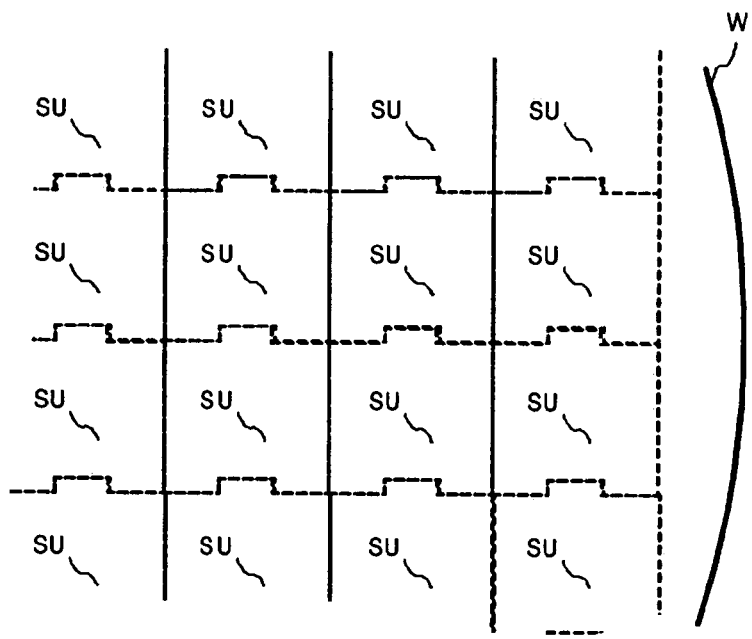
FIG. 6 is a plane view for explaining an example of an exposure of an entire wafer surface by arranging unit exposure area in a matrix.

FIG. 5 shows an example that allocates exposure allocated areas SA31 to SA39 and unexposed areas U6 and U7 by applying the offsets shown in FIG. 3. In this embodiment, the scan exposure in the unit exposure area SU is similar to the above embodiment. Since the convexness above the unit exposure area SU corresponds to the concaveness below the unit exposure area SU in this embodiment, the entire surface of wafer W can be exposed by arranging the unit exposure area SU in a matrix as in FIG. 6.

Third Embodiment

Figure 7:
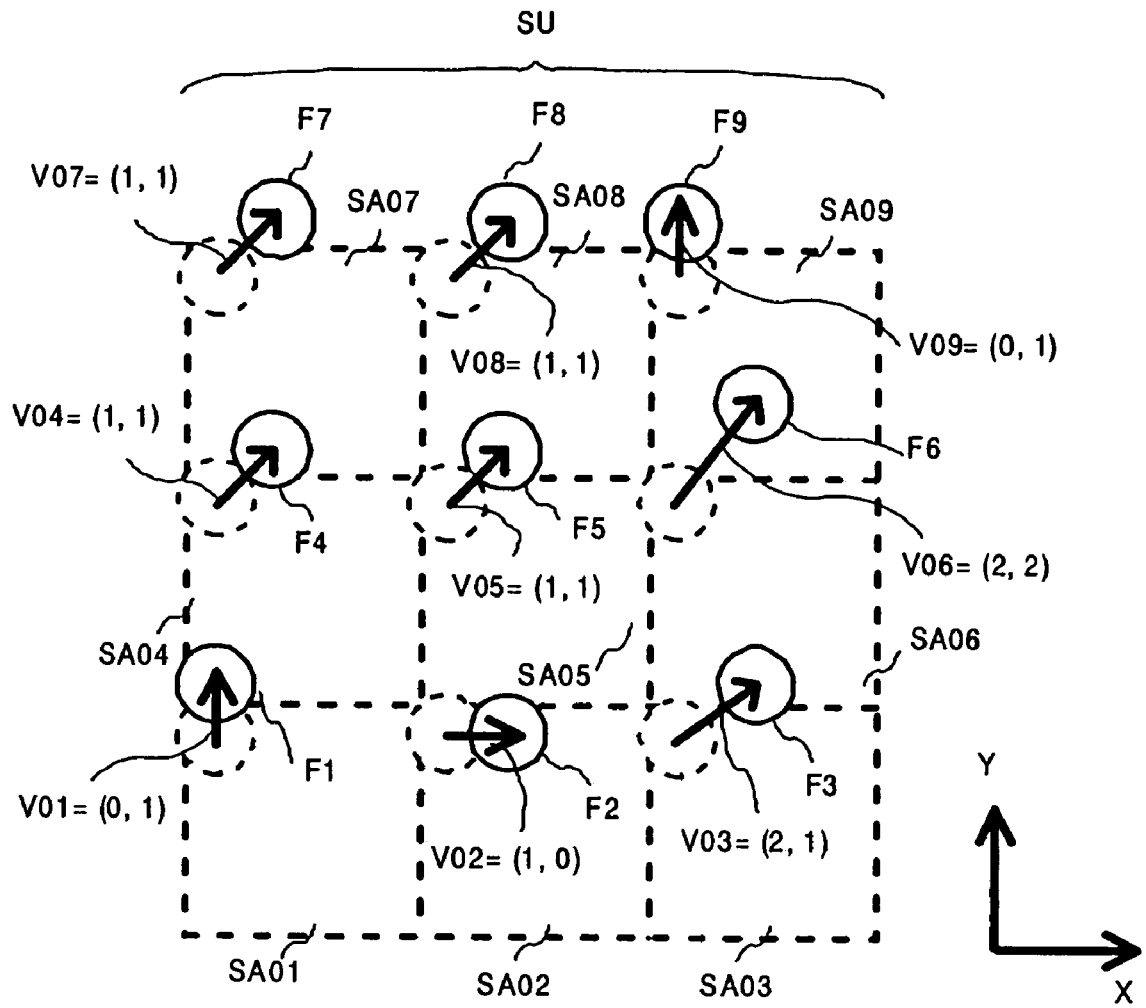
FIG. 7 is a plane view for explaining a reallocation of exposure allocated areas according to a third embodiment of the present invention.

The following third embodiment is particularly effective when each exposure spot has a certain inclination about the offset direction. FIG. 7 shows an illustrative positional offset arrangement of the exposure spots F1 to F9, where V01 to V09 denote offset amount vectors. As understood from FIG. 7, all the exposure spots shift from predetermined reference positions in the third embodiment and the direction is biased to the upper right direction. While this embodiment may allocate the exposure allocated areas similar to the above embodiments, the following method can provide a more efficient exposure.

Figure 8:
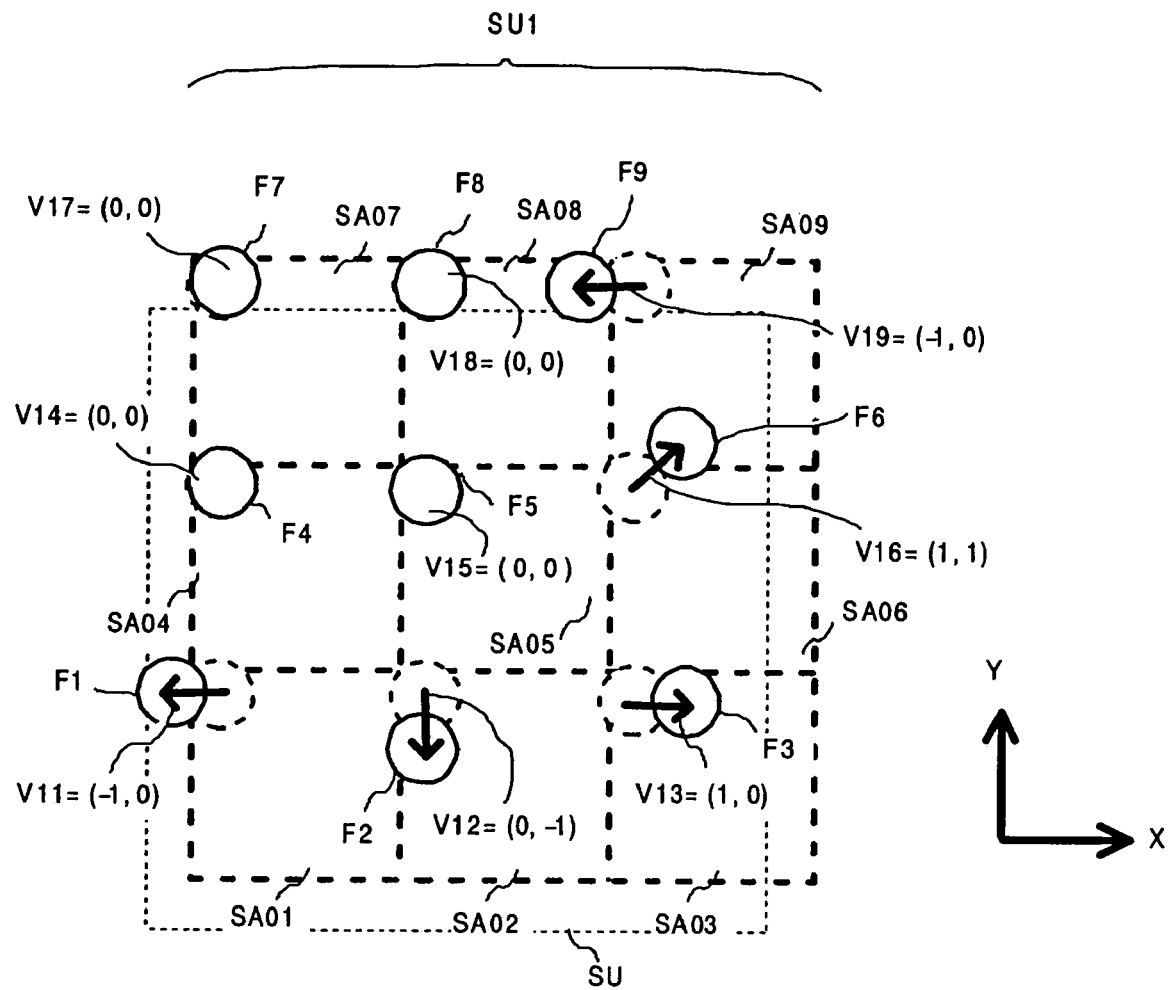
FIG. 8 is a plane view for explaining an effect of a subtraction of an average from offset amount vectors according to the third embodiment of the present invention.

Initially, an average of the offset amount vectors VM is calculated as VM=(1, 1). After the position of the stage STG is offset by the average VM of the offset amount vectors, driving for the shutter lens array SLA and the stage STG is controlled. FIG. 8 shows that each exposure spot has an offset vector that corresponds to a difference between the original offset vector and the average VM.

In FIG. 8, SU1 denotes a newly defined unit exposure area that is the unit exposure area SU offset by the average VM. The corrective offset amount vectors V11 to V19 are differences between the offset amount vectors V01 to V09 and the average VM, respectively.

The reallocation of the exposure allocated area similar to the above embodiment based on the corrective offset amount vector reduces the variance from the ideal exposure allocated area, and facilitates the allocation of the exposure allocated areas in comparison with an embodiment that does not subtract the average VM of the offset amount vectors. While the above embodiment offsets the position of the stage STG by the average VM of the offset amount vectors, similar control over the shutter lens array SLA whose position is offset by −VM provides similar effects.

Fourth Embodiment

Figure 9:
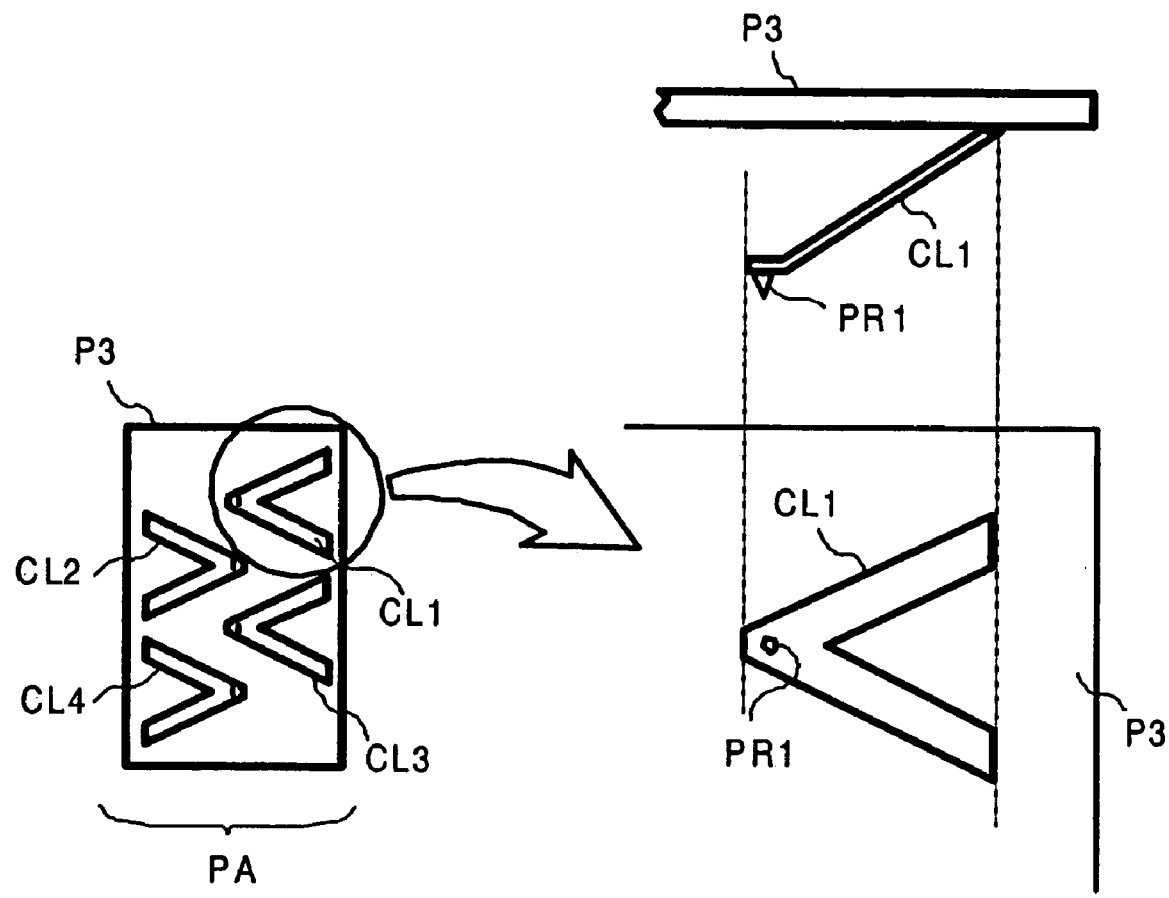
FIG. 9 is a view for explaining a structure of a probe array according to a fourth embodiment of the present invention.

While the above embodiments are directed to a maskless exposure apparatus that includes plural shutters and lenses, and exposes an arbitrary pattern using a light beam, this embodiment is applicable to a general exposure apparatus that combines plural exposure means. For example, in FIG. 9, PA denotes a probe array. The probe array PA includes plural cantilevers CL1 to CL4 that are attached to the plate P3 and constitute a cantilever array, and a fine probe is attached to a top of each cantilever. In FIG. 9, PR1 denotes one fine probe.

The height of the probe array PA is controlled so that all the fine probes contact the wafer surface, and the fine probes emit the electrons and provide the exposure under applications of the negative voltage to the fine probe and the positive voltage to the wafer. At the same time, this probe array PA can expose an arbitrary pattern onto the wafer by controlling a position in the XY directions.

Even in this probe array PA can cause the positional offset of the exposure spot due to the attachment errors of the cantilevers CL1 to C14. The reallocation of the exposure allocated area enables the probe array PA that may have a positional offset to be used for exposure without disposal.

When the exposure spots have a positional offset in the maskless exposure apparatus that irradiates plural electron beams simultaneously, the exposure allocated areas can be allocated similarly to the above embodiment. In addition, a digital micro mirror device ("DMD") instead of the shutter lens array, if inclined in accordance with the exposure pattern, is applicable to the maskless exposure apparatus that irradiates plural electron beams simultaneously.

Fifth Embodiment

Figure 14:
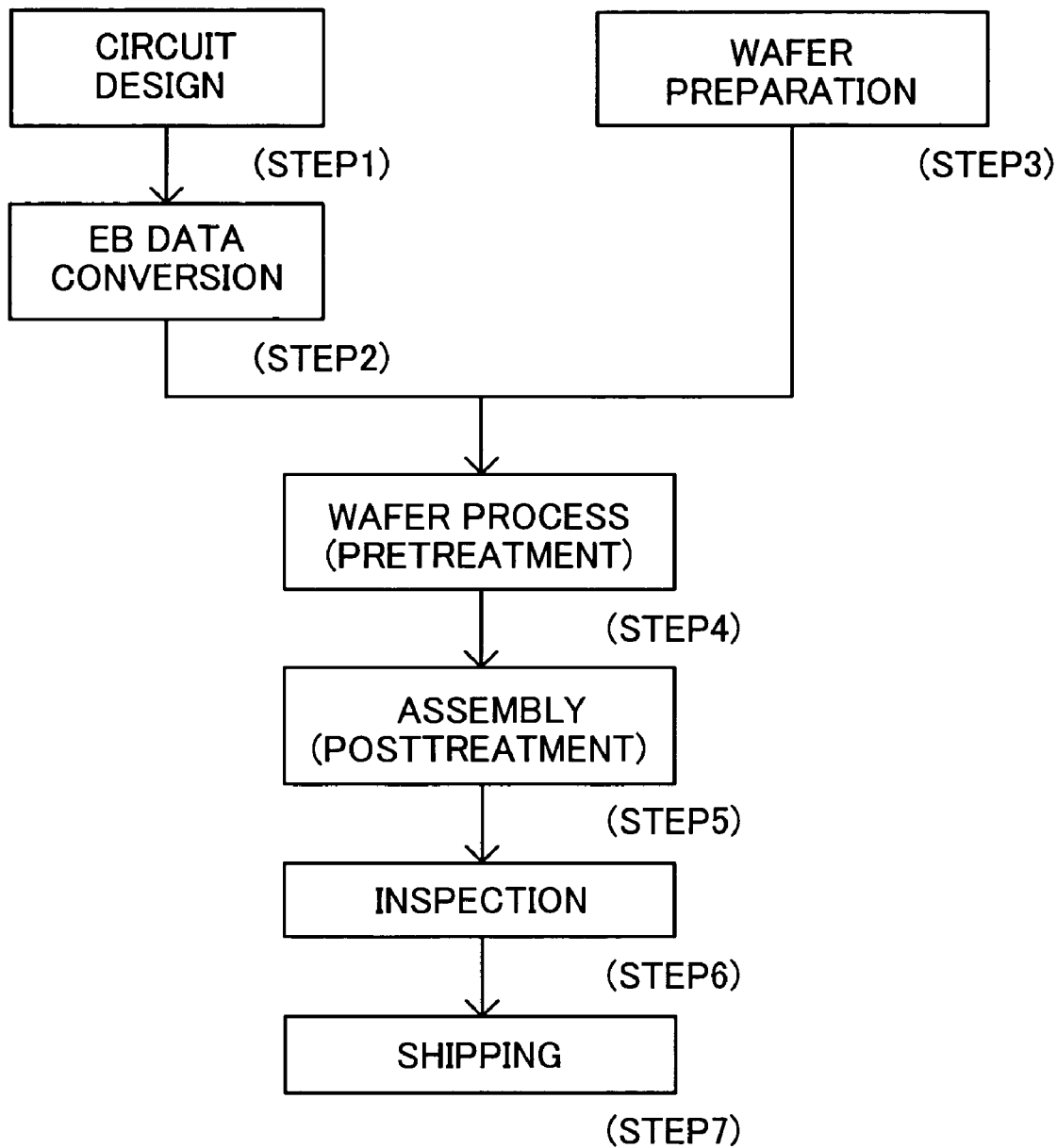
FIG. 14 is a flowchart of an entire manufacturing process for a semiconductor device.

A description will be given of a semiconductor device manufacturing process using the exposure apparatus of one of the above first to fourth embodiments. FIG. 14 is a flowchart for explaining how to fabricate devices. Step 1 (circuit design) designs a semiconductor device circuit. Step 2 (EB data conversion) prepares exposure control data for the exposure apparatus based on the designed circuit pattern. Step 3 (wafer preparation) manufactures a wafer using materials such as silicon. Step 4 (wafer process), which is also referred to as a pretreatment, forms actual circuitry on the wafer through the wafer and the exposure apparatus into which the above exposure control data is input. Step 5 (assembly), which is also referred to as a post-treatment, forms into a semiconductor chip the wafer formed in Step 4 and includes an assembly step (dicing and bonding), a packaging step (chip sealing), and the like. Step 6 (inspection) performs various tests for the semiconductor device made in Step 5, such as a validity test and a durability test. Through these steps, a semiconductor device is finished and shipped (Step 7).

The above Step 4 includes the oxidation step of oxidizing the wafer's surface, the CVD step of forming an insulating film on the wafer's surface, the electrode formation step of forming electrodes on the wafer by vapor disposition and the like, the ion implantation step of implanting ions into the wafer, the resist processing step of applying the photosensitive agent onto the wafer, the exposure step of using the above exposure apparatus to expose a circuit pattern on the mask onto the resist applied wafer after the resist processing step, the development step of developing the wafer that has been exposed in the exposure step, the etching step of etching parts other than a resist image developed in the development step, and the resist stripping step of removing disused resist after etching. These steps are repeated, and multilayer circuit patterns are formed on the wafer.

This embodiment can provide a maskless exposure apparatus that includes an exposure unit that arranges plural fine exposure means, maintains use of the exposure unit for exposure, and reduces the cost of the exposure apparatus even when the exposure spot has a positional offset due to the attachment errors of the exposure means.

This application claims a benefit of priority based on Japanese Patent Application No. 2004-088650, filed on Mar. 25, 2004, which is hereby incorporated by reference herein in its entirety as if fully set forth herein.

What is claimed is:

1. An exposure apparatus for scanning an exposure spot in an exposure allocated area and for exposing a desired pattern by controlling power of the exposure spot in accordance with an exposure pattern, said exposure apparatus comprising:
    an exposure unit for arranging plural fine exposure elements for forming plural exposure spots on an object to be exposed, and for previously defining the exposure allocated areas corresponding to the plural exposure spots respectively;
    an exposure allocated area adjuster for adjusting the exposure allocated areas in accordance with directions and sizes of offsets of the plural exposure spots from reference positions; and
    an exposure spot controller for controlling the power of the exposure spot in accordance with the exposure pattern corresponding to an actual position of each exposure spot.

2. An exposure apparatus according to claim 1, wherein said exposure allocated area adjuster includes an initial position of the exposure spot when adjusting the exposure allocated area corresponding to the exposure spot.

3. An exposure apparatus according to claim 1, wherein said exposure allocated area adjuster adjusts the exposure allocated areas so that the exposure allocated areas do not overlap each other.

4. An exposure apparatus according to claim 1, further comprising:
    a calculator for calculating an average of the offsets of the plural exposure spots from the reference positions; and
    a shifter for adjusting the exposure allocated area based on differences between the offsets of the plural exposure spots from the reference positions and the average, and for shifting a position of at least one of the exposure unit and the object to be exposed, by the average.

5. An exposure apparatus according to claim 1, wherein when a surface to be exposed is expressed as a matrix, a unit exposure area formed by combining exposure allocated areas corresponding to all the exposure spots serves as one piece in the matrix.

6. An exposure apparatus according to claim 5, wherein the piece has a rectangular shape.

7. An exposure apparatus according to claim 1, wherein said exposure unit is a shutter lens array.

8. An exposure apparatus according to claim 1, wherein said exposure unit is a fine probe array.

9. An exposure apparatus according to claim 1, wherein said exposure unit is an array of plural electron beam sources.

10. A device manufacturing method comprising the steps of:
    exposing an object using an exposure apparatus according to claim 1; and
    developing the object exposed by said exposing step.

11. An exposure apparatus comprising:
    an exposure array for arranging plural exposure sections for irradiating a beam onto an object to be exposed;
    a controller for setting an exposure area and pattern data in the exposure area based on arrangement errors of the exposure sections in said exposure array, said exposure area being exposed by the beam from each exposure section;
    a stage for moving the object relative to the exposure array based on the exposure area set by said controller; and
    a shutter array for arranging plural shutters for controlling a beam irradiation from the exposure section based on the pattern data set by said controller.

12. An exposure apparatus according to claim 11, wherein said controller sets the exposure area based on an offset direction and an offset amount of said exposure section relative to a reference position.

13. An exposure apparatus according to claim 11, wherein the exposure section irradiates a light beam or an electron beam.

14. A device manufacturing method comprising the steps of:
    exposing an object using an exposure apparatus according to claim 11; and
    developing the object exposed by said exposing step.

15. An exposure apparatus comprising:
    a probe array for arranging plural probes for emitting electrons to an object to be exposed;
    a controller for setting an exposure area and pattern data in the exposure area based on an arrangement error of the probes in said probe array, said exposure area being exposed by the electrons from each probe;

a stage for moving the object relative to the probe array based on the exposure area set by said controller; and a cantilever array for arranging plural cantilevers for controlling heights of the probes relative to the object based on the pattern data set by said controller.

16. A device manufacturing method comprising the steps of:

exposing an object using an exposure apparatus according to claim 15; and developing the object exposed by said exposing step.

* * * * *